US006373124B1

(12) United States Patent
Kato et al.

(10) Patent No.: US 6,373,124 B1
(45) Date of Patent: Apr. 16, 2002

(54) LEAD FRAME AND METHOD OF PRODUCING THE SAME, AND A SEMICONDUCTOR DEVICE USING THE SAME

(75) Inventors: Yuji Kato, Osaka; Yasuhiko Yamamoto, Shiga; Koji Hidaka, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/377,467

(22) Filed: Aug. 19, 1999

(30) Foreign Application Priority Data

Aug. 24, 1998 (JP) ............................................. 10-237659

(51) Int. Cl.$^7$ ........................ H01L 23/48; H01L 23/28; H01L 23/50
(52) U.S. Cl. ................... 257/666; 257/696; 257/698; 257/669; 257/670; 257/674; 257/672; 257/671; 257/676
(58) Field of Search ...................... 257/626, 676, 257/669, 670, 671, 672, 974, 690, 692, 698

(56) References Cited

U.S. PATENT DOCUMENTS

| | | | | | |
|---|---|---|---|---|---|
| 4,258,381 | A | * | 3/1981 | Inaba | 29/589 |
| 5,708,294 | A | * | 1/1998 | Toriyama | 257/676 |
| 5,712,507 | A | * | 1/1998 | Eguchi et al. | 257/666 |
| 5,825,054 | A | * | 10/1998 | Lee et al. | 257/676 |
| 5,859,387 | A | * | 1/1999 | Gagnon | 257/676 |
| 5,905,301 | A | * | 5/1999 | Ichikawa et al. | 257/676 |
| 5,912,237 | A | * | 6/1999 | Furuno et al. | 257/676 |
| 6,114,750 | A | * | 9/2000 | Udagawa et al. | 257/666 |
| 6,114,756 | A | * | 9/2000 | Kinsman | 257/476 |
| 6,133,623 | A | * | 10/2000 | Otsuki et al. | 257/696 |

FOREIGN PATENT DOCUMENTS

| | | |
|---|---|---|
| JP | 52-129379 | 10/1977 |
| JP | 56-98851 | 8/1981 |
| JP | 57-188857 | 11/1982 |
| JP | 62-252159 | 11/1987 |
| JP | 6-232304 | 8/1994 |
| JP | 6-244336 | 9/1994 |
| JP | 6-268143 | 9/1994 |

* cited by examiner

Primary Examiner—Alexander O. Williams
(74) Attorney, Agent, or Firm—Merchant & Gould PC

(57) ABSTRACT

This invention prevents deterioration in characteristics of a semiconductor device having a lead frame that is thin and uniform in thickness. More specifically, this invention relieves resin distortion caused by a difference in thermal expansion coefficients between the lead frame and the sealing resin in order to prevent the characteristic deterioration caused by some factors such as moisture invasion from outside and mechanical pressure. A lead frame for a resin-sealed semiconductor device of this invention is composed of an element-mount part, a horizontal part for fixing the lead frame for resin sealing, and a central lead having side leads formed in parallel on both sides thereof. The element-mount part, the horizontal part and the central lead are formed integrally. In the lead frame, at least one pair of resin-anchoring parts are formed on two opposing sides on the periphery of the element-mount part.

11 Claims, 8 Drawing Sheets

FIG. 7(A)
(PRIOR ART)
FIG. 7(B)
(PRIOR ART)
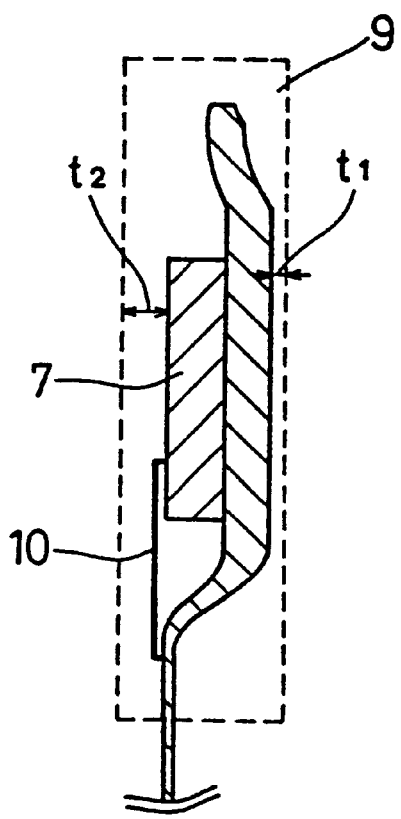
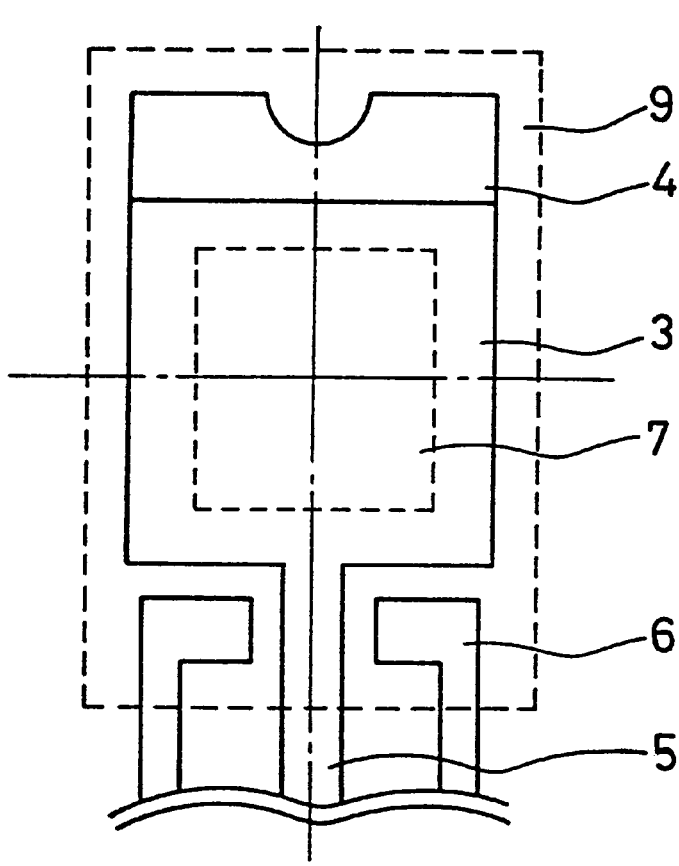

LEAD FRAME AND METHOD OF PRODUCING THE SAME, AND A SEMICONDUCTOR DEVICE USING THE SAME

FIELD OF THE INVENTION

The present invention relates to a lead frame used for mounting a semiconductor element in a resin-sealed semiconductor device for a large amount of power.

BACKGROUND OF THE INVENTION

A conventional resin-sealed semiconductor device for a large amount of power as shown in FIG. 7 comprises an element-mount part 3, a horizontal part 4 for fixing a lead frame for resin sealing and a central lead 5, and these parts (3–5) are formed integrally. A semiconductor element 7 is die-bonded to the lead frame comprising side leads that are formed in parallel on both sides of the central lead 5. The semiconductor element 7 is connected with the side leads 6 by wires 10. The central lead 5 is connected directly with an electrode on the backside of the semiconductor element 7. Alternatively, the central lead 5 can be connected by a wire 10 in the same manner as the side leads 6. The element-mount part 3 and the horizontal part 4 of the lead frame are made to be thicker than the other parts in order to efficiently radiate heat generated during operation of the semiconductor device.

The connected lead frame is sealed with resin to form a semiconductor device for a large amount of power. In this case, a resin thickness $t_1$ from the backside and from the side lead frames should be at least 0.3 mm to provide a withstand voltage of at least 5 KV. In order to protect the wires and the semiconductor, the resin thickness $t_2$ from the surface of the semiconductor element should be at least 3 mm.

For providing better thermal radiation efficiency during operations, a metal plate of a conventional lead frame is as thick as about 1.3 mm at the element-mount part and the horizontal part for positioning (both of which are to be resin-sealed), while the central lead and side leads are relatively thin, for example, about 0.6 mm. A deformed long metal plate having varied thickness entails a much higher cost for processing compared to a flat plate having even thickness. Therefore, a thin and uniform (in thickness) plate can reduce costs for both materials and processing.

However, when a metal flat plate is processed to be a uniform lead frame that is 1 mm or less in thickness, the resin will expand more in the surface than in the backside as shown in FIG. 8(B) due to the heat from the semiconductor element during operations or heat provided during solder reflux, while the surface resin contracts as shown in FIG. 8(C) when the resin is cooled to a room temperature or below, since the sealing resin has a greater thermal expansion coefficient compared to the metal material of the lead frame. Conventionally, distortion of the resin caused by the thermal expansion and contraction does not affect the semiconductor element, since a thick element-mount part is sufficiently strong. For a thin lead frame, the resin becomes thick if the backside of the same resin at the element-mount part has the thickness equal to a conventional backside resin. As a result, the surface resin will be further distorted, the thin element-mount part can be deformed and the semiconductor element can crack.

In addition, since the resin expands considerably due to heat generated by the resin itself or heat from outside, gaps are formed between the lead frame and the resin. This may cause deterioration in properties caused by the invasion of moisture from outside through the gap.

SUMMARY OF THE INVENTION

In order to solve the above-mentioned problems, this invention relieves resin distortion in a thin and uniform lead frame caused by the difference in thermal expansion coefficients between the lead frame and the sealing resin after repetitions of heating and cooling during solder reflux and during operations of a power semiconductor element, so that this invention prevents deterioration of the properties of the semiconductor element due to moisture invasion from outside and mechanical pressure caused by a gap formed between the lead frame and the sealing resin.

For this purpose, a lead frame of this invention includes a part for mounting an element of a resin-sealed semiconductor device, a horizontal part for fixing the lead frame for resin sealing, and a central lead formed integrally with the element-mount part and the horizontal part, where side frames are formed in parallel on both sides of the central lead. The element-mount part and the central lead have the same thickness of no more than 1 mm, and at least one pair of resin-anchoring parts are provided on the opposing two sides on the periphery of the element-mount part, and wherein the resin-anchoring parts are notches whose inner portions are wider than the openings.

As a result, resin will cohere in the horizontal direction, and a semiconductor element can be protected from applied mechanical and thermal stress. The moisture resistance is also improved. Thus, the reliability of the semiconductor device can be improved.

Similar effects can be obtained if the resin-anchoring parts are protrusions. Furthermore, the notches are preferably trapezoidal or the like, but the shape is not limited thereto. Any shapes can be selected as long as similar effects can be expected.

It is also preferable that the resin-anchoring parts are formed at four corners on the periphery of the element-mount part. More preferably, the resin-anchoring parts are arranged symmetrically with respect to centerlines of the element-mount part. In this arrangement, the resin-anchoring parts can be placed at substantially the same distance from the center of the element-mount part. So the resin will cohere uniformly, and stress due to thermal expansion or external pressure can be dispersed uniformly.

It is also preferable that the lead frame is bent upward at one side opposing to the side of the element-mount part connected with the central lead, so that a semiconductor device including a lead frame of this invention can be fixed securely to a mount board.

It is also preferable that at least one pair of resin-anchoring parts are formed on both sides of the central lead at one side of the element-mount part to which the central lead is connected, so that the resin will cohere in the length direction (Y direction) as well as the width direction (X direction).

It is also preferable that the central lead connected to the element-mount part is bent upward in the vicinity of the connection, so that deformation and distortion due to the difference in thermal expansion coefficients can be reduced.

It is also preferable that the notches are bent upward, so that the backside resin can be prevented from being thinned at the point.

It is also preferable that the notches formed on one side of the element-mount part have a depth not more than the plate thickness of the element-mount part. If the depth is less than 80% of the plate thickness, cutting out the notches by using a cutting-blade becomes difficult. The depth should not exceed the plate thickness of the element-mount part since excessively deep notches may reduce the element-mount part area.

It is also preferable that the inner sides of the notches formed on one side of the element-mount part are parallel to the element-mount part, so that the resin will cohere and provide a uniform load on the lead frame in order to uniformly disperse stress caused by thermal expansion or external pressure.

A method of producing a lead frame of this invention, that is, a lead frame including a part for mounting an element of a resin-sealed semiconductor device, a horizontal part for fixing the lead frame for resin sealing, and a central lead that is formed integrally with the element-mount part and the horizontal part, where side lead frames are formed in parallel on both sides of the central lead, comprises a process including a step of providing a central lead that has a thickness equal to the element-mount part, and a step of providing at least one pair of resin-anchoring parts on two opposing sides on the periphery of the element-mount part by cutting the element-mount part from the backside.

In the structure, the resin will cohere in the horizontal direction, and the semiconductor element can be protected from applied mechanical or thermal stress. The moisture resistance also is improved. As a result, the reliability of the semiconductor device can be improved.

A semiconductor device of this invention includes a lead frame that is composed of a part for mounting an element of a resin-sealed semiconductor device, a horizontal part for fixing the lead frame for resin sealing, and a central lead that is formed integrally with the element-mount part and the horizontal part, where side lead frames are formed in parallel on both sides of the central lead. The element-mount part and the central lead have the same thickness of no more than 1mm, and the semiconductor device has a lead frame having at least one pair of resin-anchoring parts on the opposing two sides on the periphery of the element-mount part where the resin-anchoring parts are notches whose inner portions are wider than the openings, a semiconductor element mounted on the element-mount part, and a resin envelope for sealing the lead frame and the semiconductor element integrally.

In the structure, the resin will cohere in the horizontal direction in the lead frame, and the semiconductor element can be protected from applied mechanical or thermal stress. The moisture resistance is also improved. As a result, semiconductor devices with high reliability can be provided.

It is preferable for the semiconductor device of this invention that the resin-anchoring parts are arranged symmetrically with respect to the semiconductor element. In this arrangement, the resin-anchoring parts can be placed substantially the same distance from the center of the element-mount part. So the resin will cohere uniformly and stress caused by thermal expansion or external pressure can be dispersed uniformly.

BRIEF DESCRIPTION OF THE DRAWINGS

FIG. 7 is a plan and side view of a semiconductor device including a conventional lead frame.

DETAILED DESCRIPTION OF THE PREFERRED EMBODIMENT

Figure 1A:
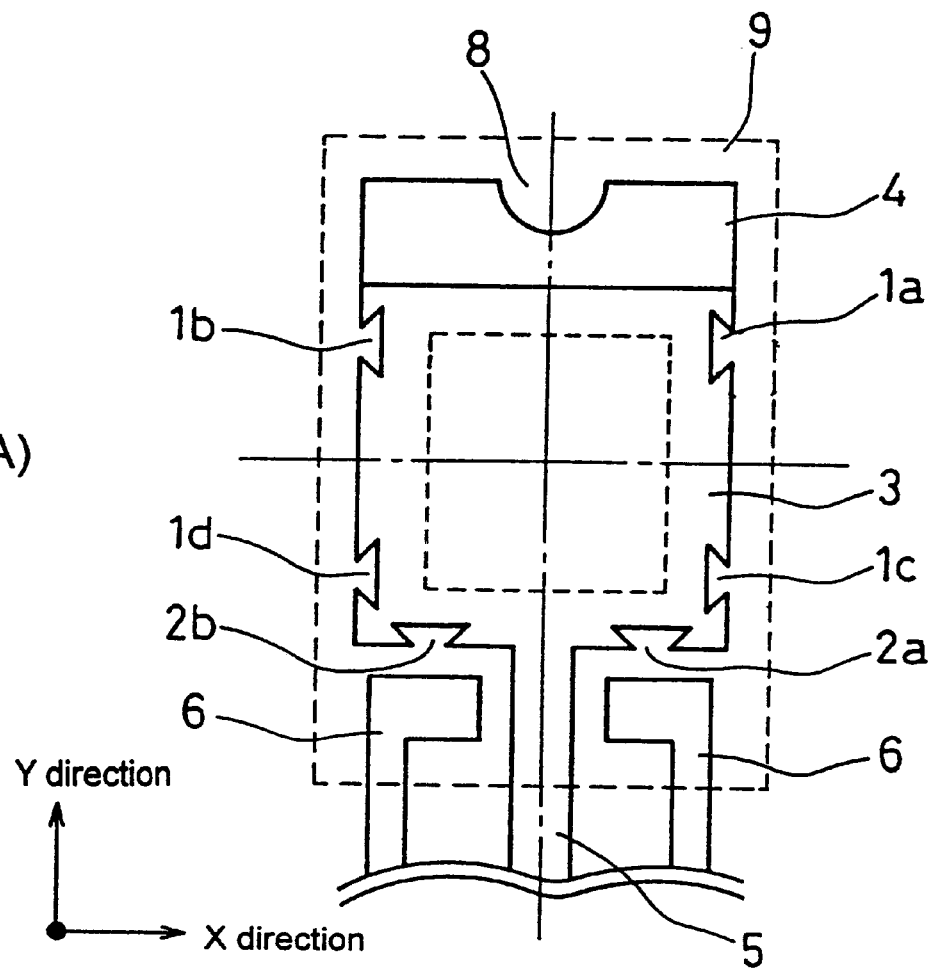
FIG. 1(A) is a plan view of a lead frame in an embodiment of this invention.
Figure 1B:
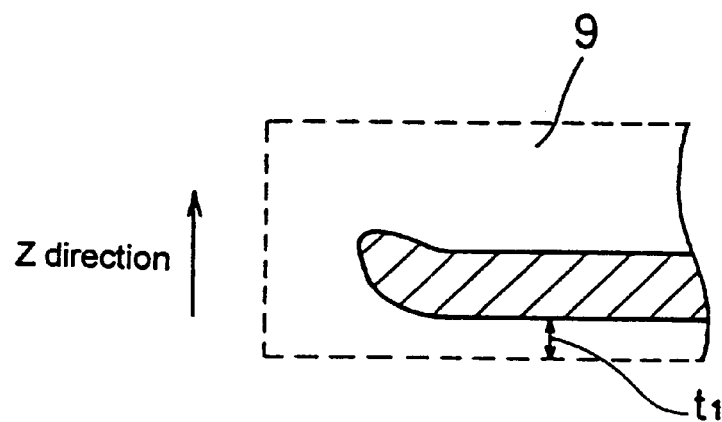
FIG. 1(B) is a side view of a part of notches in a lead frame in an embodiment of this invention.

Lead frames according to this invention are explained below by referring to the drawings. FIGS. 1(A) is a plan view of a lead frame of this invention, and FIG. 1(B) is a side view of a lead frame of this invention.

In FIG. 1(A), a lead frame comprises an element-mount part 3 for mounting a semiconductor chip, a horizontal part 4 formed with a screw hole 8, and a central lead 5, and the parts (3–5) are formed integrally. The horizontal part 4 is used to fix the lead frame with a pin when the element is sealed with resin 9, using the screw hole 8 to fix the semiconductor element to a mount board. Side leads 6 are formed in parallel on both sides of the central lead 5. Two pairs of substantially inverse trapezoidal notches 1a–1d are formed on the opposing sides of the element-mount part 3 other than the sides having the horizontal part 4 and central lead 5. The four notches 1a–1d are positioned substantially the same distance from the center of the element-mount part. Substantially-inverse trapezoidal notches 2a and 2b are formed on each side of the central lead 5.

Figure 6:
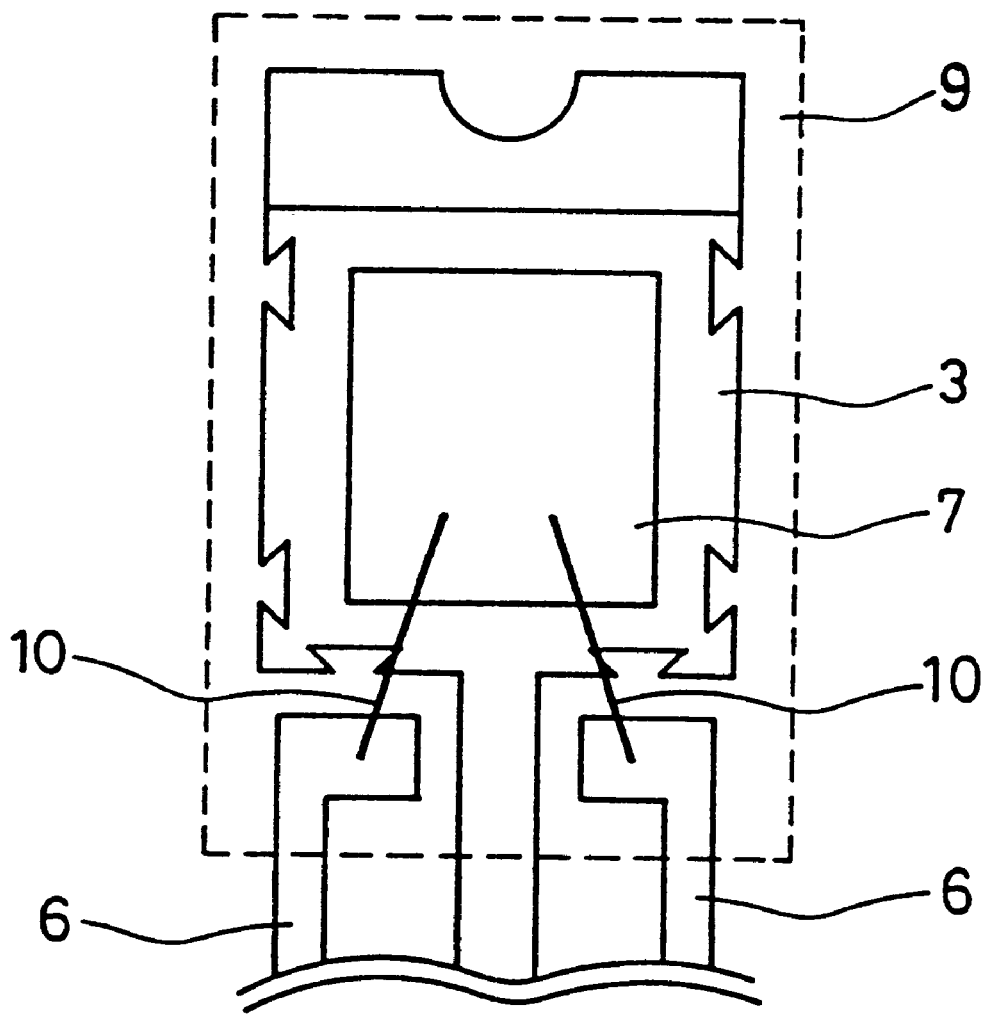
FIG. 6 is a plan view of a semiconductor device including a lead frame of this invention.
Figure 8A:
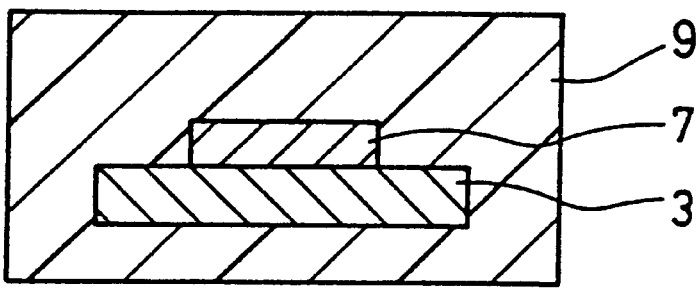
FIGS. 8(A)–8(C) are cross sectional views to show a semiconductor device distorted by heat.
Figure 8B:
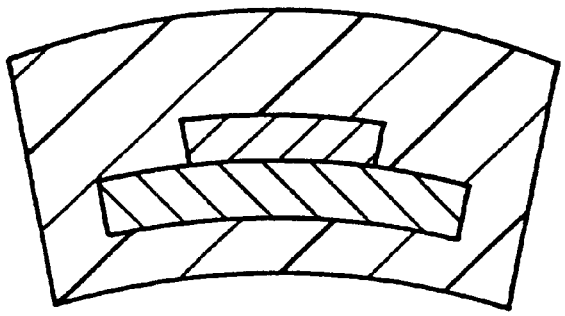
Figure 8C:
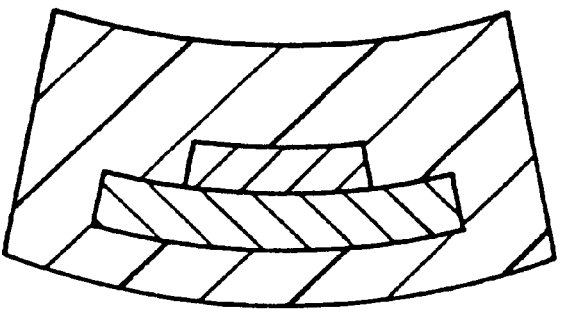

As shown in FIG. 6, a semiconductor element 7 for a large amount of power is bonded to the element-mount part 3 with a solder (Pb:Sn=97:3) by using a lead frame in this invention. Subsequently, wires 10 (aluminum fine wires) are bonded by ultrasonic bonding to connect the side leads 6 and the element. Then, the semiconductor element is sealed with resin for protection from the external environment. After that, leads are processed to have a predetermined shape and the lead parts (5,6) are dipped with a solder (Pb:Sn=63:37), so that a semiconductor device for a large amount of power is obtained.

In this structure, resin will enter the notches during a sealing step. As the notches are formed to be substantially inverse trapezoidal in shape, the resin will cohere in both the horizontal X and Y directions. So distortion of the resin can be relieved, and thus, a gap between the lead frame and the sealing resin caused by heating and cooling can be prevented.

Furthermore, the notches are formed in the sides opposing in the X direction at a substantially equal distance from the center of the element-mount part. Therefore, the resin will cohere uniformly, and stress caused by thermal expansion or external pressure can be dispersed uniformly.

A lead frame for a semiconductor is made by cutting out a copper plate. Therefore, in a lead frame of this invention, sharp edges in the notches warp significantly. The backside resin thickness $t_1$ should be at least 0.3 mm to provide a withstand voltage of at least 5 KV. If the edges warp excessively to the backside, the backside resin becomes thin at the point, and thus, a secure withstand voltage cannot be provided. When the copper plate is cut out from the backside to the surface of the element-mount part, the plate will warp toward the surface of the element-mount part as shown in FIG. 1(B), and the backside resin thickness $t_1$ will not be reduced at the point. Furthermore, deformation due to resin distortion at the surface can be decreased since the plate warping is directed to the thicker side (surface side) of the resin.

The notches are formed by cutting with a metal die. The die edges may be worn greatly if the notches have less depth. Preferably, the notches have a depth of about 80% or more of the plate thickness of the element-mount part. Since excessively deep notches decrease the area of the element-mount part, the depth is better not to exceed the thickness of the element-mount part.

Figure 2:
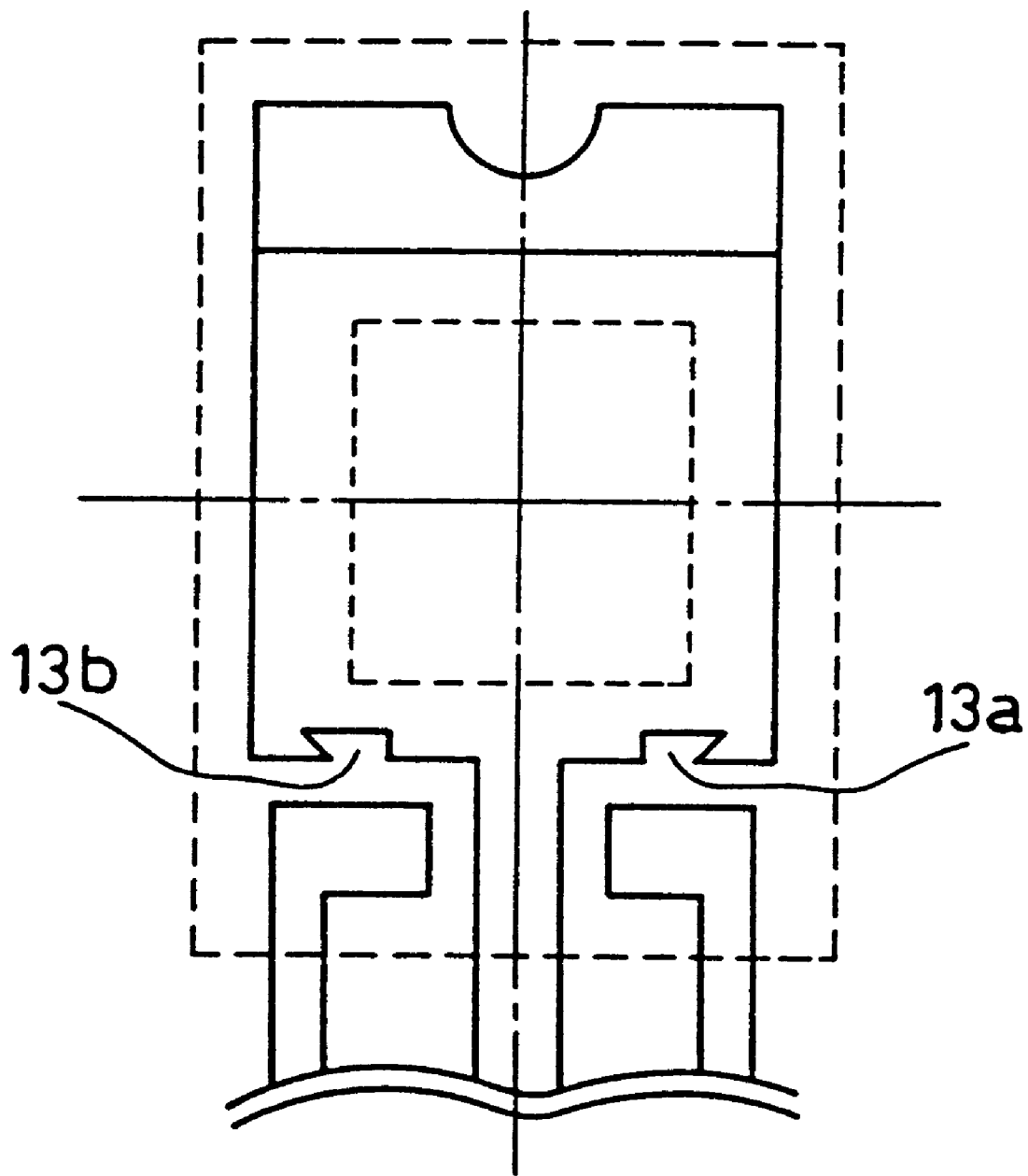
FIG. 2 is a plan view of a lead frame in an embodiment of this invention.

In FIG. 2, inverse trapezoidal notches (13a, 13b) are formed on the side facing the side leads. The notches (13a, 13b), whose edges adjacent to the center are perpendicular to the side, are formed symmetrically on both sides of the central lead. In this structure, deformation in the X and Y directions and in the diagonal direction can be prevented sufficiently even if the resin expands and contracts more than the metal. The notches preferably are shaped to be trapezoids with an inclination of about 45°. The inclination is not always provided to the both sides, but it can be provided to one side. It is more effective if the inclination is arranged to enclose the semiconductor element.

Figure 3:
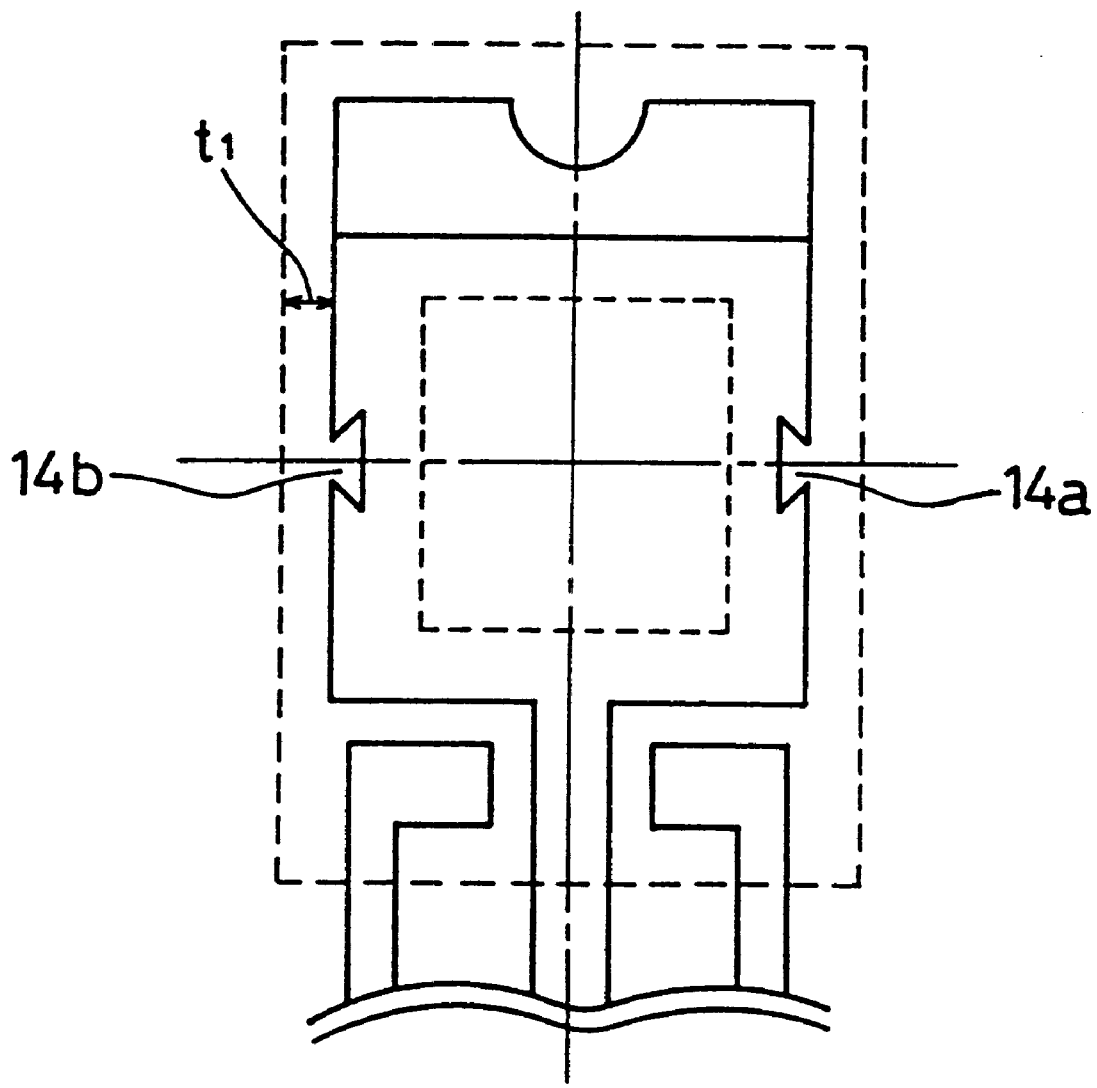
FIG. 3 is a plan view of a lead frame in an embodiment of this invention.
Figure 4:
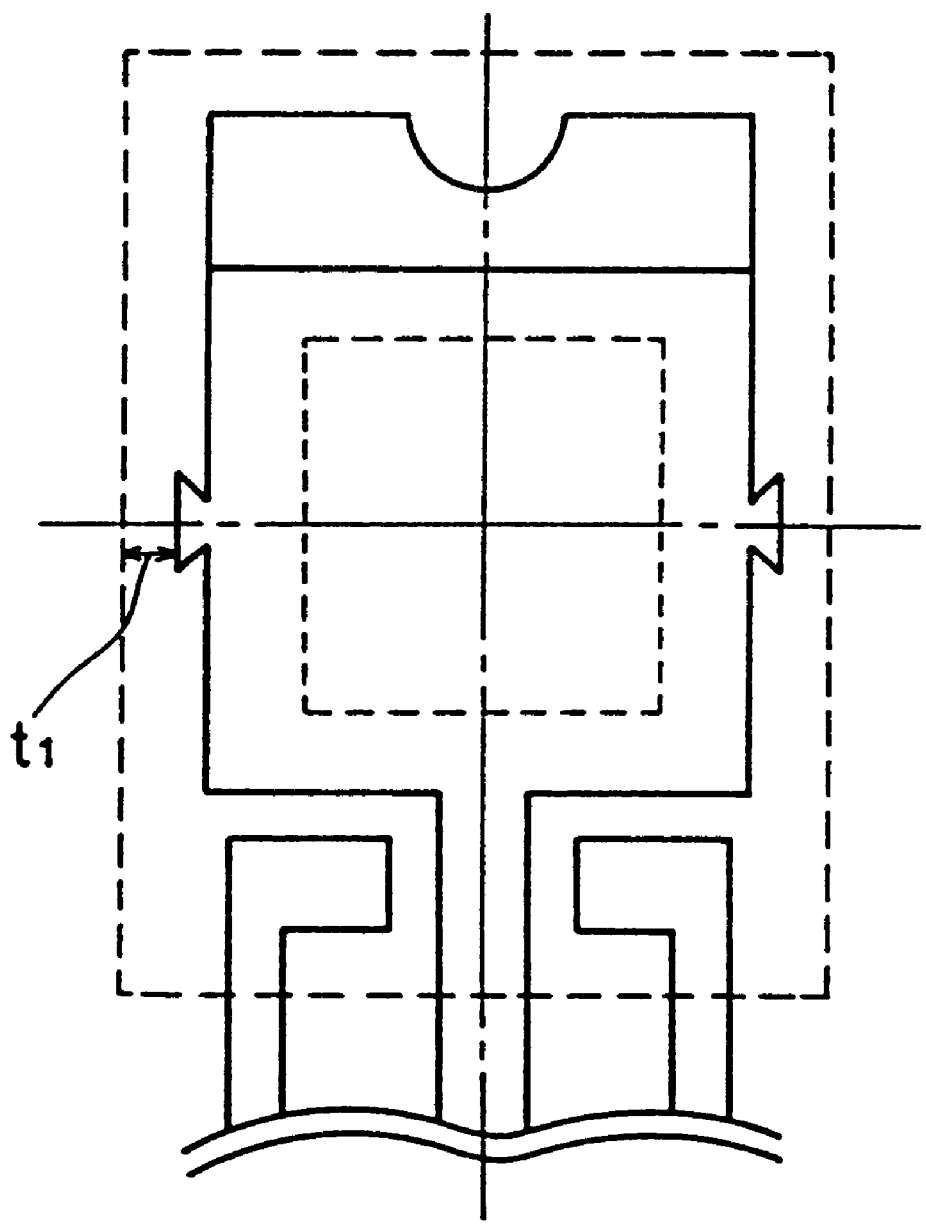
FIG. 4 is a plan view of a lead frame in an embodiment of this invention.

In FIG. 3, inverse trapezoidal notches (14a, 14b) are formed oppositely to the sides horizontally with respect to a centerline of the element-mount part. Such notches are effective in relieving deformation and distortion caused by expansion and contraction in the Y direction. This structure also can prevent the resin and the lead frame from slipping off in the X direction. FIG. 4 shows that similar effects can be obtained by forming trapezoidal protrusions at the same positions of the notches (14a, 14b) as shown in FIG. 3.

Figure 5:
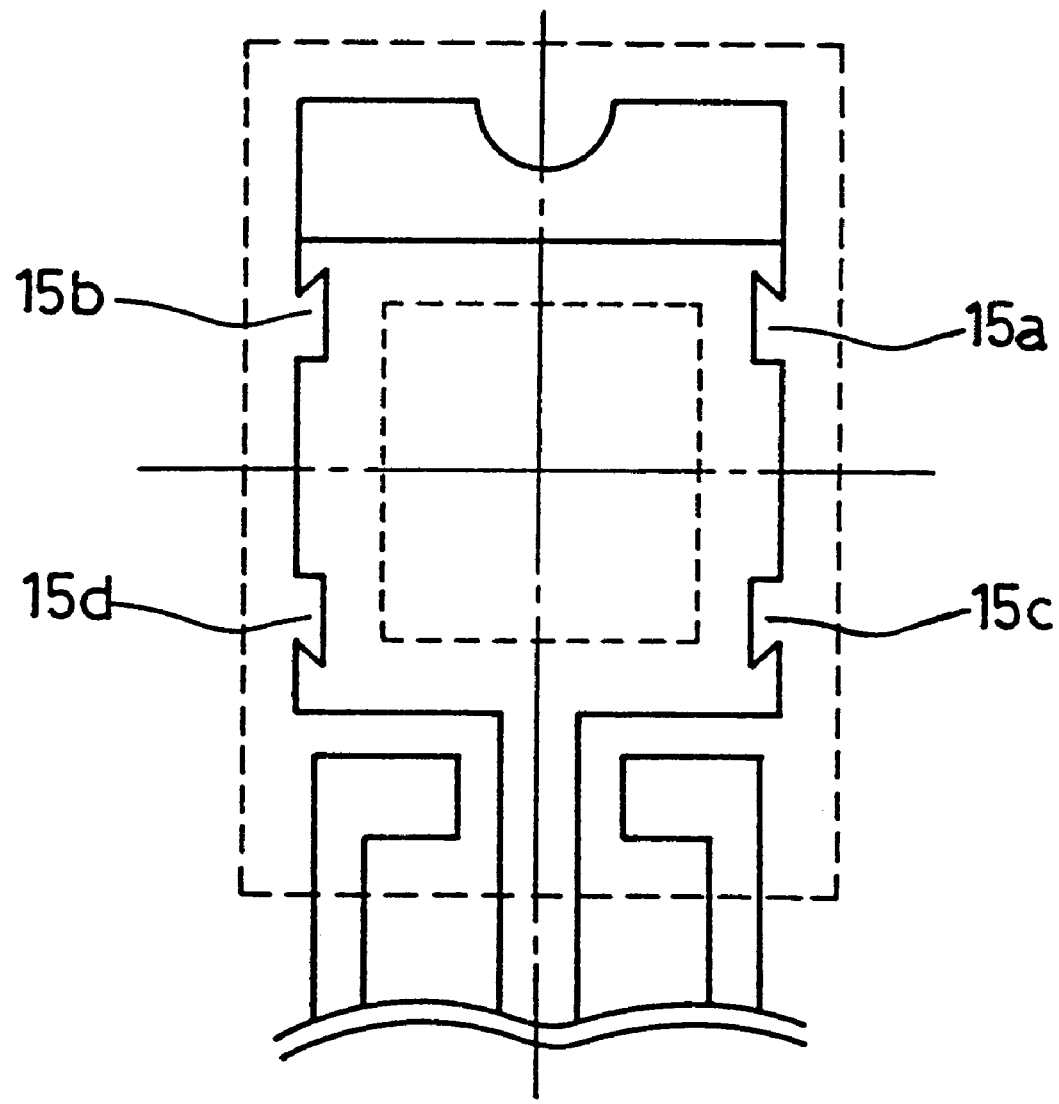
FIG. 5 is a plan view of a lead frame in an embodiment of this invention.

In FIG. 5, two pairs of notches (15a–15d) are formed on the opposing sides of the element-mount part at an equal distance from the center of the element-mount part. For every inverse trapezoidal notch, only one of the edges of sharp angles is substantially perpendicular, and the sharp angular portions of the protrusions at the four notches are directed to the four corners. Accordingly, deformation and distortion caused by expansion and contraction in the X and Y directions can be relieved, and slip-off of the resin and the lead frame in the X and Y directions can be prevented.

As mentioned above, the embodiments of this invention improve cohesion between the lead frame and resin considerably even if thermal stress and external mechanical stress are applied as a result of repeated heating and cooling during solder reflux or operations.

A thermal shock test (a test including repetitions of 5 minutes of Ta=−55° C. and 5 minutes of Ta=150° C.) was carried out for a lead frame of this invention and a conventional lead frame. The results of the evaluation are shown in Table 1. Table 2 shows the evaluation results of a pressure cooker test (Ta=121° C.; 2 atmospheric pressure, t=100 H) to compare lead frames of this invention and conventional lead frames. Tables 1 and 2 show the ratio of the number of semiconductor element samples whose initial characteristic values are doubled or become larger to the total number of test samples.

TABLE 1

| Classification | 50 times | 100 times | 150 times | 200 times |
| --- | --- | --- | --- | --- |
| Product of this invention | 0/50 | 0/50 | 0/50 | 0/50 |
| Conventional product | 0/50 | 0/50 | 3/50 | 7/50 |

TABLE 2

| Classification | 50 hours | 100 hours | 150 hours | 200 hours |
| --- | --- | --- | --- | --- |
| Product of this invention | 0/50 | 0/50 | 0/50 | 0/50 |
| Conventional product | 0/50 | 0/50 | 3/50 | 7/50 |

In Table 1, a few samples of the conventional lead frames have considerably-varied properties when the test was repeated 150 times, and more samples have varied properties when the test was repeated 200 times. On the other hand, no lead frame samples of this invention have drastically-varied characteristic values even when the test was repeated 200 times. This result shows that lead frames of this invention can improve reliability of semiconductor elements.

Similar effects are shown in Table 2. These tables demonstrate that the lead frames of this invention have cohesion that is remarkably improved compared to conventional lead frames. Results of the thermal shock test and the pressure cooker test demonstrate also that the reliability level of the semiconductor devices of this invention is considerably improved.

As mentioned above, a lead frame of this invention is formed with at least one pair of substantially-inverse trapezoidal notches on the opposing two sides on the periphery of an element-mount part in order to relieve thermal distortion caused by the difference in thermal expansion coefficients between the metallic lead frame material and the sealing resin. The difference in the coefficients becomes remarkable as the lead frame is made thin. As a result, horizontal cohesion of the resin is improved, the cohesion is also improved and so is the moisture resistance.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A lead frame comprising a part for mounting an element of a resin-sealed semiconductor device, a horizontal part for fixing the lead frame for resin sealing, and a central lead formed integrally with the element-mount part and the horizontal part, where side leads are formed in parallel on both sides of the central lead, wherein the element-mount part and the central lead have the same thickness of no more than 1 mm, and at least one pair of resin-anchoring parts are provided on opposing two sides on the periphery of the element-mount part and wherein the resin-anchoring parts are notches whose inner portions are wider than the openings, the notches are bent upward so that the resin will cohere and not become thin, thus providing a uniform load on the lead frame to evenly disperse stress caused by thermal expansion or external pressure and the notches are formed on one side of the element-mount part with a depth not more than the plate thickness of the element-mount part.

2. The lead frame according to claim 1, wherein the resin-anchoring parts are formed at four corners on the periphery of the element-mount part.

3. The lead frame according to claim 1, wherein the resin-anchoring parts are arranged symmetrically with respect to centerlines of the element-mount part.

4. The lead frame according to claim 1, wherein the lead frame is bent upward at one side opposing to the side of the element-mount part connected with the central lead.

5. The lead frame according to claim 1, wherein at least one pair of resin-anchoring parts are formed on both sides of the central lead at one side of the element-mount part to which the central lead is connected.

6. The lead frame according to claim 1, wherein the central lead connected to the element-mount part is bent upward in the vicinity of the connection.

7. The lead frame according to claim 1, wherein the notches are trapezoidal.

8. The lead frame according to claim 1, wherein the resin-anchoring parts are protrusions.

9. The lead frame according to claim 1, wherein the inner sides of the notches formed on one side of the element-mount part are parallel to the element-mount part.

10. A semiconductor device comprising a lead frame that is composed of a part for mounting an element of a resin-sealed semiconductor device, a horizontal part for fixing the lead frame for resin sealing, and a central lead that is formed integrally with the element-mount part and the horizontal part, where side leads are formed in parallel on both sides of the central lead;

wherein the element-mount part and the central lead have the same thickness of no more than 1 mm, and the semiconductor device has a lead frame having at least one pair of resin-anchoring parts on the two opposing sides on the periphery of the element-mount part and wherein the resin anchoring parts are notches whose inner portions are wider than the openings, the notches are bent upward so that the resin will cohere and not become thin, thus providing a uniform load on the lead frame to evenly disperse stress caused by thermal expansion or external pressure, and the depth of the notch opening is equal to or less than a thickness of the element-mount part, a semiconductor element mounted on the element-mount part, and a resin envelope for sealing the lead frame and the semiconductor element integrally, the resin thickness being at least 0.3 mm at the side opposing the element-mount part.

11. The semiconductor device according to claim 10, wherein the resin-anchoring parts are arranged symmetrically with respect to the semiconductor element.

\* \* \* \* \*